United States Patent
Oi et al.

(10) Patent No.: US 9,837,363 B2
(45) Date of Patent: Dec. 5, 2017

(54) POWER-MODULE SUBSTRATE UNIT AND POWER MODULE

(71) Applicant: MITSUBISHI MATERIALS CORPORATION, Tokyo (JP)

(72) Inventors: Sotaro Oi, Kitamoto (JP); Tomoya Oohiraki, Kitamoto (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 15/320,798

(22) PCT Filed: Jun. 30, 2015

(86) PCT No.: PCT/JP2015/068884
§ 371 (c)(1),
(2) Date: Dec. 21, 2016

(87) PCT Pub. No.: WO2016/002803
PCT Pub. Date: Jan. 7, 2016

(65) Prior Publication Data
US 2017/0154855 A1    Jun. 1, 2017

(30) Foreign Application Priority Data

Jul. 4, 2014 (JP) ................................. 2014-138716
Jun. 30, 2015 (JP) ................................. 2015-130972

(51) Int. Cl.
*H01L 23/373* (2006.01)
*H01L 23/00* (2006.01)
*H01L 23/31* (2006.01)

(52) U.S. Cl.
CPC ........ *H01L 23/562* (2013.01); *H01L 23/3114* (2013.01); *H01L 23/3735* (2013.01); *H01L 24/40* (2013.01); *H01L 2224/40225* (2013.01)

(58) Field of Classification Search
None
See application file for complete search history.

(56) References Cited

U.S. PATENT DOCUMENTS

2007/0181988 A1    8/2007   Han et al.
2011/0277320 A1    11/2011  Han et al.
(Continued)

FOREIGN PATENT DOCUMENTS

JP    2003-078086 A    3/2003
JP    2007-027261 A    2/2007
(Continued)

OTHER PUBLICATIONS

International Search Report dated Aug. 18, 2015, issued for PCT/JP2015/068884.

*Primary Examiner* — Dung Le
(74) *Attorney, Agent, or Firm* — Locke Lord LLP

(57) ABSTRACT

In a power-module substrate unit, a circuit layer is structured by a plurality of small circuit layers; a ceramic substrate layer is structured by at least one plate; the small circuit layers are formed to have a layered structure having a first aluminum layer bonded on one surface of the ceramic substrate layer and a first copper layer bonded on the first aluminum layer by solid diffusion; a radiation plate is made of copper or copper alloy; the metal layer and the radiation plate are bonded by solid diffusion.

9 Claims, 6 Drawing Sheets

(56) References Cited

U.S. PATENT DOCUMENTS

| | | | |
|---|---|---|---|
| 2013/0071686 A1 | 3/2013 | Oda et al. | |
| 2015/0041188 A1* | 2/2015 | Terasaki | H01L 23/3735 174/252 |
| 2016/0021729 A1* | 1/2016 | Nagatomo | H01L 25/07 361/748 |
| 2016/0035660 A1* | 2/2016 | Terasaki | B32B 15/01 174/252 |

FOREIGN PATENT DOCUMENTS

| | | |
|---|---|---|
| JP | 2007-214572 A | 8/2007 |
| JP | 2008-147308 A | 6/2008 |
| JP | 2013-157578 A | 8/2013 |
| WO | 2011/155379 A1 | 12/2011 |

\* cited by examiner

US 9,837,363 B2

POWER-MODULE SUBSTRATE UNIT AND POWER MODULE

BACKGROUND OF THE INVENTION

Technical Field

The present invention relates to a power-module substrate unit and a power module used for a semiconductor device controlling large current and high voltage.

Priority is claimed on Japanese Patent Application No. 2014-138716, filed Jul. 4, 2014, and Japanese Patent Application No. 2015-130972, filed Jun. 30, 2015, the content of which is incorporated herein by reference.

Background Art

For a power module, a power-module substrate in which a metal plate forming a circuit layer is joined on one surface of a ceramic substrate such as aluminum nitride and a heat-radiation plate joined on another surface is used. A semiconductor element such as a power element is mounted on the circuit layer of the power-module substrate with soldering material therebetween.

A module is downsized along with high power density of the semiconductor element, so integration of the module is highly required. As general integration of power modules, it is known to array a plurality of circuit layers and add on an insulated substrate. However, when the plurality of circuit layers are provided on the insulated substrate, a warp may be incurred by fluctuation of temperature while a manufacturing process or using. If the power-module substrate is warped, a yield rate of the power module may be deteriorated because of failure in mounting the semiconductor element in a mounting process, and radiation performance may be deteriorated while practical use. Accordingly, it is necessary to manufacture a power-module substrate without a warp.

Patent Document 1 discloses a power module, providing insulated substrates (wiring ceramic substrates in which wiring a wiring layer is formed on a ceramic substrate), joining the insulated substrates to each other by joining members (lead frames), and molding the insulated substrate and the power semiconductor element by sealing resin. Patent Document 1 also describes that it is possible to prevent a crack of the ceramic substrate and separation of the sealing resin by a structure of using the multiple insulating substrates.

Patent Document 2 discloses a power module in which insulated substrates (circuit substrates) are positioned by a positioning member directly holding them without using the lead frames as in the power module described in Patent Document 1.

CITATION LIST

Patent literature

Patent Document 1: Japanese Unexamined Patent Application, First Publication No. 2007-27261
Patent Document 2: Japanese Unexamined Patent Application, First Publication No. 2013-157578

SUMMARY OF INVENTION

Technical Problem

However, by the method described in Patent Document 1, even though it is possible to maintain good radiation performance by preventing the crack of the ceramic substrate and the separation of the sealing resin, it is difficult to obtain accuracy of position of the respective insulated substrates because the wiring members (the lead frames) having not so high rigidity determine the position. Accordingly, higher integration is difficult.

By the method in which the insulated substrate is directly held as described in Patent Document 2, it is not easy to accurately position the multiple insulated substrates because of restriction of a molding die.

The present invention is achieved in consideration of the above circumstances, and has an object to provide a power-module substrate unit and a power module in which deformation by fluctuation of temperature is small, radiation performance is good, and circuits can be integrated.

Solution to Problem

The present invention is a power-module substrate unit including a ceramic substrate layer; a circuit layer structured from a plurality of small circuit layers joined on one surface of the ceramic substrate layer; a metal layer joined on other surface of the ceramic substrate layer; and one radiation plate joined on the metal layer: the power-module substrate unit in which each of the small circuit layers has a layered structure including a first aluminum layer joined on the one surface of the ceramic substrate layer and a first copper layer joined on the first aluminum layer by solid diffusion bonding; the metal layer is made from a same material as that of the first aluminum layer; the radiation plate is made from copper or copper alloy and joined on the metal layer by solid diffusion bonding; and a ratio $(t1 \times A1 \times \sigma1)/(t2 \times A2 \times \sigma2)$ is not smaller than 0.80 and not larger than 1.20 where a thickness of the first copper layer is $t1$ (mm), a bonding area of the first copper layer is $A1$ (mm$^2$), an yield stress of the first copper layer is $\sigma1$ (N/mm$^2$), a thickness of the radiation plate at a bonding position to the metal layer is $t2$ (mm), a bonding area of the radiation plate is $A2$ (mm$^2$), an yield stress of the radiation plate is $\sigma2$ (N/mm$^2$).

By forming the circuit layer (the small circuit layers) as the layered structure of the first aluminum layer and the first copper layer; arranging the radiation plate made of copper or copper alloy on the other side of the circuit layer that is counter to the ceramic substrate layer with the metal layer made of the same material as that of the first aluminum layer therebetween; and setting relation between the thicknesses, the boning areas, and the yield stresses of the first copper layer of the circuit layer and the radiation plate to the above-mentioned range, it is possible to structure a symmetrical structure centering the ceramic substrate layer. That is to say, in a case in which the circuit layer is made to be patterned by arranging the plurality of small circuit layers on the radiation plate, although a shape of a bonded part of the circuit layer and a shape of a bonded part of the radiation plate bonded to the metal layer are different; it is possible to improve a symmetric property centering the ceramic substrate layer by considering the symmetric property of the first copper layer and the radiation plate in these bonded parts.

As a result, internal stresses on both the surfaces of the ceramic substrate layer by heating or the like are not much biased, so that it is possible to prevent a warp deformation. Accordingly, it is possible to prevent the warp deformation also in a mounting process or in a usage environment of the semiconductor element, not only a primary warp deformation when layering respective layers: therefore it is possible to improve reliability as an insulating substrate and show an excellent radiation property. Moreover, it is possible to accurately position the plurality of small circuit layers and advance high integration by joining the plurality of small circuit layers on one radiation plate.

In the power-module substrate unit according to the present invention, the ceramic substrate layer may be structured by a same number of small ceramic substrates as that of the small circuit layers; the metal layer may be structured by a same number of small metal layer as that of the small circuit layers; and a plurality of power-module substrate made by joining the small circuit layers and the small metal layers to each other with the small ceramic substrate therebetween may be joined on the radiation plate with spacing.

In the power-module substrate unit according to the present invention, it is acceptable that a power-module substrate joined on the radiation plate with the metal layer made of one plate therebetween is provided, in which the ceramic substrate layer is structured by a same number of small ceramic substrate as that of the small circuit layers; layered substrates are structured by joining the small circuit layers and the small ceramic substrates; the power-module substrate is structured by joining the layered substrates with spacing on the metal plate.

In the power-module substrate unit according to the present invention, it is acceptable that a power-module substrate joined on the radiation plate with the metal layer therebetween is provided, in which the ceramic substrate layer is structured by one plate; the metal layer is structured by a same number of small metal layers as that of the small circuit layers; and the power-module substrate is structured by joining the small circuit layers and the small metal layers with the ceramic substrate layer therebetween with spacing in a surface direction of the ceramic substrate layer.

In the power-module substrate unit according to the present invention, it is acceptable that a power-module substrate joined on the radiation plate with the metal layer structured by one plate therebetween is provided, in which the ceramic substrate layer is structured by one plate; the small circuit layers are joined on the one surface of the ceramic substrate layer with spacing; and the power-module substrate is structured by joining the metal layer on the other surface of the ceramic substrate layer.

In the above structures, by setting relation between the first copper layer and the radiation layer to have the ratio $(t1 \times A1 \times \sigma 1)/(t2 \times A2 \times \sigma 2)$ to be not smaller than 0.80 and not larger than 1.20, it is possible to form a symmetric structure centering the ceramic substrate layer. As a result, the internal stresses on both the surfaces of the ceramic substrate layer by heating or the like are not much biased, so that it is possible to prevent the warp deformation.

Furthermore, in a case in which the ceramic substrate layer is structured by one ceramic substrate having relatively low thermal expansion coefficient and high rigidity, the internal stresses on both the surfaces of the ceramic substrate layer are not much biased when heating or like, so it is possible to improve an effect of preventing the warp deformation.

In the power-module substrate unit according to the present invention, the first aluminum layer and the first copper layer may be joined with a titan layer therebetween by solid diffusion bonding.

In the power-module substrate unit according to the present invention, the metal layer and the radiation plate may be joined with a titan layer therebetween by solid diffusion bonding.

In the power-module substrate unit according to the present invention, the first aluminum layer and the first copper layer, and the metal layer and the radiation plate may be respectively joined with titan layers therebetween by solid diffusion bonding.

Since one or either of the first aluminum layer and the first copper layer or the metal layer and the radiation plate are joined with the titan layers therebetween by solid diffusion bonding, it is possible to prevent growth of intermetallic compound of Al and Cu when the power-module substrate unit is heated to high temperature and improve bonding reliability and life.

A power module according to the present invention includes the power-module substrate unit; a semiconductor element and an external-connection lead frame which are connected to at least one of the small circuit layers of the power-module substrate unit; and a molded resin sealing the semiconductor element and the power-module substrate unit except a surface of the radiation plate.

By using the power-module substrate unit in which the plurality of small circuit layers are joined on one radiation plate, it is easy to produce an integrated power module. Moreover, since the power-module substrate unit is integrated by the one radiation plate, it is hard to be shifted or deformed even though resin pressure is applied when sealing.

Advantageous Effects of Invention

According to the present invention, it is possible to prevent deformation by fluctuation of temperature in the mounting process and the usage environment of the semiconductor element, improve reliability as an insulating substrate and connection reliability of the semiconductor element, and show the excellent radiation property. Moreover, since the plurality of small circuit layers can be accurately positioned, it is possible to high integration.

DESCRIPTION OF EMBODIMENTS

Below, embodiments of the present invention will be explained referring drawings.

Figure 1:
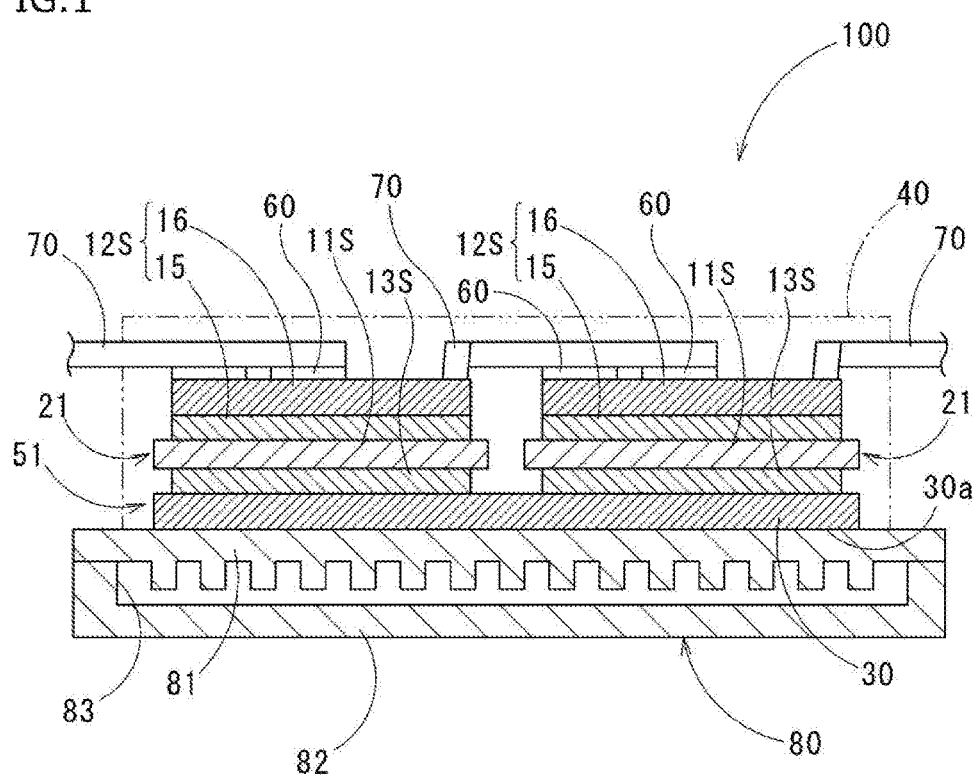
[FIG. 1] It is a sectional view showing a power module of a first embodiment according to the present invention.

A power module 100 of an embodiment shown in FIG. 1 is provided with a power-module substrate unit 51, semiconductor elements 60 joined to the power-module substrate unit 51, and external-connection lead frames 70: the semiconductor elements 60 and the power-module substrate unit 51 are resin-sealed by a molded resin 40 except a surface (an exposed surface 30*a*) of a radiation plate 30. This power module 100 is fixed in a state in which the exposed surface 30*a* of the radiation plate 30 is pushed to a surface of a heat sink 80, for example.

Figure 2A:
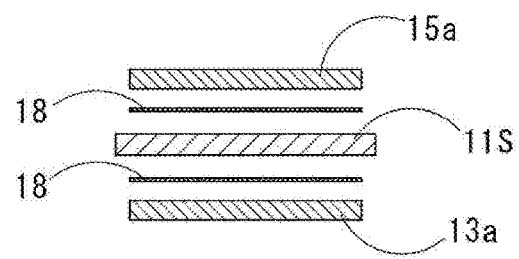
[FIG. 2] It is a sectional view showing a producing process of a power-module substrate unit of the first embodiment according to the present invention.
Figure 2B:
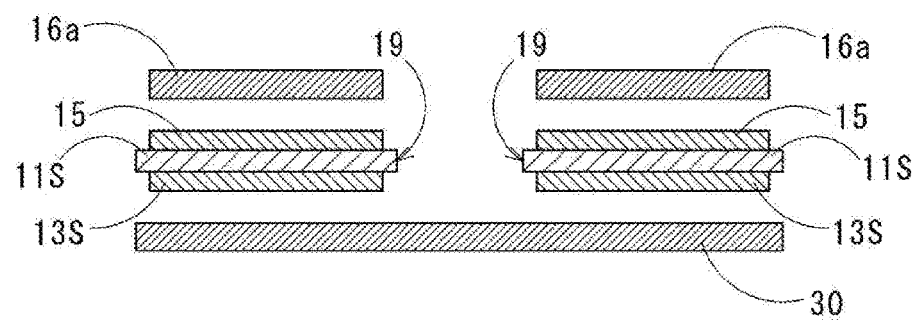
Figure 2C:
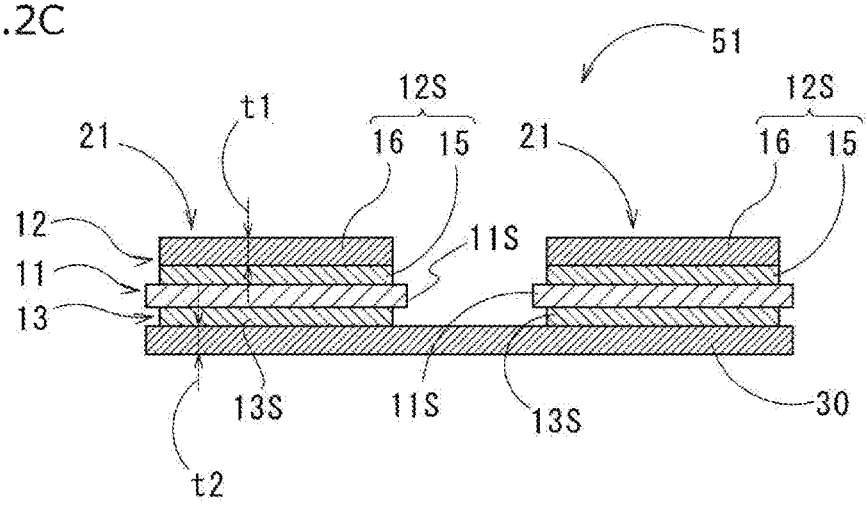
Figure 4:
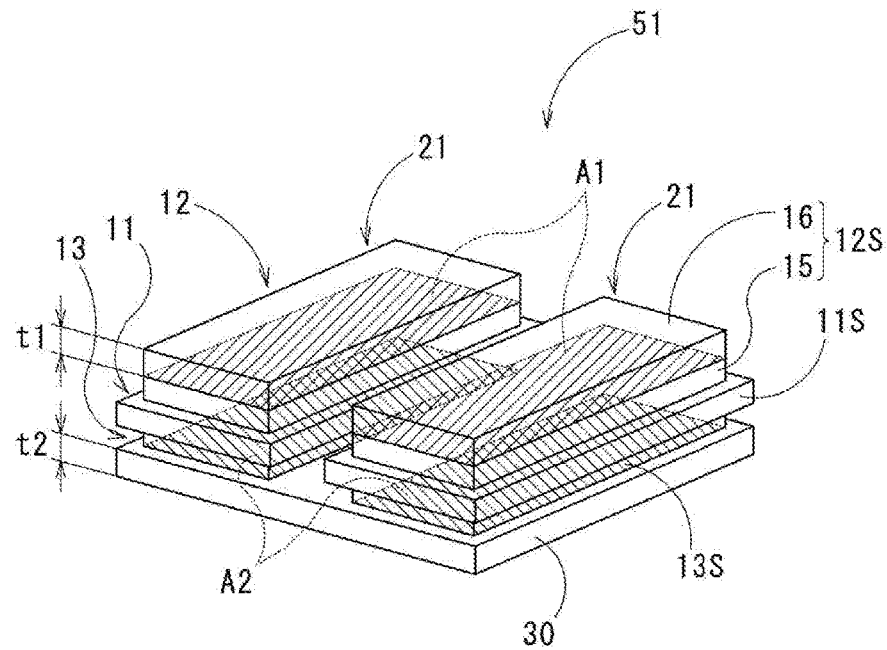
[FIG. 4] It is a perspective view of the power-module substrate unit of the first embodiment shown in FIG. 1.

As shown in FIG. 1, FIG. 2C and FIG. 4, in the power-module substrate unit 51, a circuit layer 12 is joined on one surface of a ceramic substrate layer 11, and the one radiation plate 30 is joined on another surface of the ceramic substrate layer 11 with a metal layer 13 therebetween. The circuit layer 12 is structured by a plurality of small circuit layers 12S. The ceramic substrate layer 11 is structured by at least one plate. The metal layer 13 is structured by at least one plate.

In the power-module substrate unit 51 of the present embodiment shown in FIG. 1, FIG. 2C and FIG. 4, the ceramic substrate layer 11 is structured by a same number of small ceramic substrates 11S as that of the small circuit layers 12S, and the metal layer 13 is structured from a same number of small metal layers 13S as that of the small circuit layers 12S. Power-module substrates 21 in which the small circuit layers 12S and the small metal layers 13S are joined with the small ceramic substrates 11S therebetween is joined on the one radiation plate 30 with spacing. These power-module substrates 21 are each formed by joining the small circuit layer 12S on the one surface of the small ceramic substrate 11S by brazing, and by joining the small metal layer 13S on the other surface of the small ceramic substrate 11S by brazing.

The small ceramic substrates 11S forming the ceramic substrate layer 11 may be made of, for example, nitride ceramics such as AlN (aluminum nitride), $Si_3N_4$ (silicon nitride) and the like, or oxide ceramics such as $Al_2O_3$ (alumina) and the like. Thickness of the small ceramic substrates 11S may be set in a range of 0.2 to 1.5 mm.

The small circuit layers 12S forming the circuit layer 12 has a layered structure including a first aluminum layer 15 joined on the surface of the ceramic substrate layer 11 (the small ceramic substrate 11S) and a first copper layer 16 joined on the first aluminum layer 15.

The first aluminum layers 15 each are made by joining a plate material of pure aluminum or aluminum alloy to the ceramic substrate layer 11 (the small ceramic substrate 11S). In the present embodiment, the first aluminum layers 15 each are made by brazing an aluminum plate having purity of 99.99 mass % or higher, 1N99 in the JIS standard (purity of 99.99 mass % or higher: the so-called 4N aluminum) on the small ceramic substrate 11S. The first copper layers 16 each are made by joining a plate material of pure copper or copper alloy on the first aluminum layer 15. In the present embodiment, the first copper layer 16 is made by joining a copper plate of oxygen-free copper on the first aluminum layer 15 by solid-diffusion. Thickness of the first aluminum layer 15 is not smaller than 0.1 mm and not larger than 3.0 mm. Thickness of the first copper layer 16 is not smaller than 0.5 mm and not larger than 5.0 mm.

The small metal layers 13S forming the metal layer 13 are made of a same material as that of the first aluminum layer 15 of the circuit layer 12 (the small circuit layers 12S). In the present embodiment, the small metal layers 13S each are made by brazing an aluminum plate formed to have thickness of not smaller than 0.1 mm and not larger than 3.0 mm and purity of 99.99 mass % or higher which is the same as the first aluminum layer 15 on the small ceramic substrate 11S. The small circuit layers 12S and the small metal layers 13S are formed to have substantially a same size of flat plate shape.

The radiation plate 30 is made of a plate material of pure copper or copper alloy: the small metal layers 13S of the power-module substrate 21 are joined on the radiation plate 30 respectively by solid diffusion. In the present embodiment, the radiation plate 30 is made of zirconium-addition heat-resistance copper alloy (ZC alloy manufactured by Mitsubishi Shindoh Co., Ltd.: Cu 99.98 wt %-Zr 0.02 wt %) into a flat plate with thickness 1.5 mm: as shown in FIG. 1 and FIG. 2, the radiation plate 30 is larger than the circuit layer 12 structured by the small circuit layers 12S and the metal layer 13 structured by the small metal layers 13, to have a flat plate shape larger than a bonding surface between the circuit layer 12 and the ceramic substrate layer 11.

In the radiation plate 30 and each of the first copper layers 16 of the respective small circuit layers 12S, a ratio (t1×A1×σ1)/(t2×A2×σ2) is set to be not smaller than 0.80 and not larger than 1.20 where a thickness of the first copper layer 16 is t1 (mm), a bonding area of the first copper layer 16 to the first aluminum layer 15 is A1 ($mm^2$), an yield stress of the first copper layer 16 is σ1 ($N/mm^2$), a thickness of the radiation plate 30 at a bonding position to the metal layer 13 (the small metal layers 13S ) is t2 (mm), a bonding area of the metal layer 13 to the radiation plate 30 is A2 ($mm^2$), and an yield stress of the radiation plate 30 is σ2 ($N/mm^2$).

For example, in a case in which the first copper layer 16 is C1020 with thickness t1=2.0 mm (the yield stress σ1=195 $N/mm^2$), the bonding area A1 between the first copper layer 16 and the first aluminum layer 15 is 800 $mm^2$, the radiation plate 30 is heat residence alloy ZC manufactured by Mitsubishi Shindoh Co., Ltd. with thickness t2=1.4 mm (the yield stress σ2=280 $N/mm^2$), and the bonding area A2 between the metal layer 13 and the radiation plate 30 is 900 $mm^2$, the ratio (t1×A1×σ1)/(t2×A2×σ2)=0.88. The yield stresses in the present invention are values at room temperature (25° C.). The bonding area A1 is a sum total of respective bonding areas between the first copper layers 16 and the first aluminum layers 15 in the power-module substrates 21. Similarly, the bonding area A2 is a sum total of respective bonding areas between the small metal layers 13S of the power-module substrates 21 and the radiation plate 30.

On surfaces of the small circuit layers 12S of the respective power-module substrates 21 configuring the power-module substrate unit 51, the semiconductor elements 60 are soldered. On these semiconductor elements 60 and the small circuit layers 12S, the external-connection lead frames 70 are connected. The semiconductor elements 60 and the power-module substrate unit 51 are integrally resin-sealed by the molded resin 40, except the surface (the exposed surface 30*a*) of the radiation plate 30. The external-connection lead frames 70 are provided so that a part sticks out from the molded resin 40.

The semiconductor elements 60 are electronic parts including semiconductor: IGBT (Insulated Gate Bipolar Transistor), MOSFET (Metal Oxide Semiconductor Field Effect Transistor), FWD (Free Wheeling Diode) and the like are variously selected as required functions. Soldering material bonding the semiconductor elements 60 is, for example, Sn—Sb based solders, Sn—Ag based solders, Sn—Cu based solders, Sn—In based solders, or Sn—Ag—Cu based solders (so-called lead-free solder).

The external-connection lead frames 70 are, for example, made of copper or copper alloy, and connected by ultrasonic bonding, soldering, or the like.

The molded resin 40 is, for example, formed by transfer mold using epoxy resin including filler of $SiO_2$ or the like, for example.

The power module 100 structured as above is used in a state of being fixed on the heat sink 80 as shown in FIG. 1. The heat sink 80 in the present embodiment is for radiation of heat of the power module 100, includes a top plate 81 on which the radiation plate 30 of the power module 100 is fixed, and a cooling part 82 having a pass 83 for flowing cooling medium (e.g., cooling water). The power module 100 and the heat sink 80 are fixed by being pressed by a spring or the like, with grease (not illustrated) between the radiation plate 30 of the power module 100 and the top plate 82 of the heat sink 80.

It is desirable that the heat sink 80 is made of material having good thermal conductivity: it is made of aluminum alloy (A6063 alloy) in this embodiment. As the heat sink 80 on which the power module 100 is fixed, a flat plate, one in which a multiple-pin fin is formed integrally by hot forging or the like, one in which belt fins parallel to each other are integrally formed by extrusion molding and the like, suitable shapes can be used. As for a heat sink made of aluminum or copper, the power module can be fixed by soldering.

Next, an example of a producing method of power-module substrate unit 51 and the power module 100 structured as above will be explained.

First, as shown in FIG. 2A, a first-layer aluminum plate 15a to be the first aluminum layer 15 of the small circuit layer 12S is stacked on one surface of the small ceramic substrate 11S, and a metal-layer aluminum plate 13a to be the small metal layer 13S is stacked on another surface, and then these are joined together. For joining these, brazing material of Al—Si based alloy or the like is used. For example, a stacked body S in which the small ceramic substrate 11S, the first-layer aluminum plate 15a, and the metal-layer aluminum plate 13a are stacked with a brazing foil 18 of above-mentioned alloy therebetween is pressed in a stacking direction using a press device 110 shown in FIG. 3.

Figure 3:
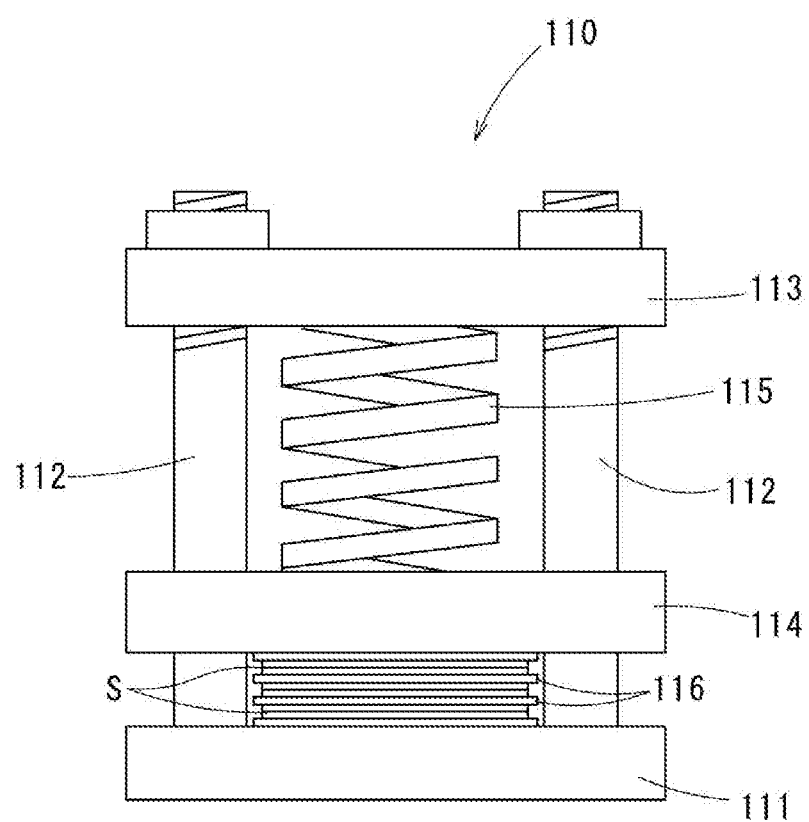
[FIG. 3] It is a frontal view showing an example of a press device for producing the power-module substrate unit of the first embodiment of the present invention.

The press device 110 shown in FIG. 3 is provided with a base plate 111, guide posts 112 vertically fixed at four corners on an upper surface of the base plate 111, a fixing plate 113 fixed on top ends of the respective guide posts 112, a pressing plate 114 held by the guide posts 112 so as to move vertically between the base plate 111 and the fixing plate 113, and a biasing device 115 such as a spring or the like provided between the fixing plate 113 and the pressing plate 114 biasing the pressing plate 114 downward.

The fixing plate 113 and the pressing plate 114 are arranged to be parallel with the base plate 111. The aforementioned stacked bodies S are arranged between the base plate 111 and the pressing plate 114. On both surfaces of the stacked bodies S, carbon sheets 116 are arranged in order to make pressing force even.

The stacked bodies S being pressed by the press device 110 are placed in a heating furnace (not illustrated) together with the press device 110, and brazed by heating to brazing temperature under vacuum atmosphere. In this case, the pressing force is set to 0.68 MPa (7 kgf/cm$^2$), and the heating temperature is set to 640° C., for example.

As shown in FIG. 2B, a first-layer copper plate 16a to be the first copper layer 16 and the radiation plate 30 are bonded to respective bonded bodies 19 in which the small ceramic substrate 11S, the first aluminum layer 15 and the small metal layer 13S are bonded. A stacked body in which the first-layer copper plate 16a is stacked on the first aluminum layer 15 of the bonded body 19 and the radiation plate 30 is stacked on the small metal layer 13S is heated together with the press device 110 under the vacuum atmosphere in a pressed state in a stacking direction using the press device 110 as FIG. 3, so that the small circuit layer 12S is made by bonding the first aluminum layer 15 and the first copper layer 16 by solid diffusion, and the small metal layer 13S and the radiation plate 30 are bonded by solid diffusion. In this case, the pressing force is not lower than 0.29 MPa and not higher than 3.43 MPa, and the heating temperature is not lower than 400° C. and lower than 548° C., for example. By maintaining this pressing and heating state for not shorter than 5 minutes and not longer than 240 minutes, the first aluminum layer 15 with the first copper layer 16, and the small metal layer 13S with the radiation plates 30 are bonded by solid diffusion at the same time, the power-module substrate unit 51 can be obtained (FIG. 2C and FIG. 4).

In this embodiment, the bonded surfaces of the first aluminum layer 15 and the first copper layer 16, and the bonded surfaces of the small metal layer 13S and the radiation plate 30 are smoothed by removing scratches in advance of the solid diffusion bonding. Favorable heating temperature of vacuum heating in the solid diffusion bonding is a range not lower than eutectic temperature of aluminum and copper −5° C. and lower than the eutectic temperature.

The solid diffusion bonding of the first aluminum layer 15 with the first copper layer 16 and the small metal layer 13S with the radiation plate 30 is not limited to a simultaneous operation. The respective steps can be performed without limiting to the above embodiment: for example, the first aluminum layer 15 and the first copper layer 16 may be bonded in advance so as to make the power-module substrate 21, then the small metal layer 13S and the radiation plate 30 may be bonded.

To the small circuit layer 12S of the power-module substrate unit 51 manufactured as above, the semiconductor elements 60 are soldered (by die bonding). Then, after bonding the external-connection lead frames 70 to the semiconductor elements 60 and the small circuit layers 12S by methods such as ultrasonic bonding, soldering or the like, the molded resin 40 is formed by transfer molding so that the semiconductor elements 60 and the power-module substrate unit 51 are resin-sealed except the exposed surface 30a of the radiation plate 30.

In the power-module substrate unit 51 produced as above, since the ratio (t1×A1×σ1)/(t2×A2×σ2) is set to the range not smaller than 0.80 and not larger than 1.20 where the thickness of the first copper layer 16 is t1 (mm), the bonding area between the first aluminum layer 15 and the first copper layer 16 is A1 (mm$^2$), the yield stress of the first copper layer 16 is σ1 (N/mm$^2$), the thickness of the radiation plate 30 at the bonding position to the metal layer 13, i.e., at the bonding positions to the respective small metal layer 13S is t2 (mm), the boning area between the metal layer 13 and the radiation plate 30 is A2 (mm$^2$), the yield stress of the radiation plate 30 is σ2 (N/mm$^2$): therefore the symmetry structure centering the ceramic substrate layer 11 is made. That is to say, in cases in which the ratio (t1×A1×σ1)/(t2×A2×σ2) is 1.00, not smaller than 0.80 and smaller than 1.00, and larger than 1.00 and not larger than 1.20, the symmetrical structure centering the ceramic substrate layer 11 can be suitably structured.

As in the present embodiment, by considering the aforementioned ratio in the bonding part of the circuit layer 12 and the bonding part of the radiation plate 30 in which the metal layer 13 is bonded, the symmetric property centering the ceramic substrate layer 11 can be improved. As a result, the internal stresses on both the surfaces of the ceramic substrate layer 11 by heating or the like are not much biased, so that it is possible to prevent the warp deformation. Accordingly, it is possible to prevent the warp deformation also in the mounting process of the semiconductor elements 60 or in the usage environment, not only the primary warp deformation when layering respective layers: therefore it is possible to improve reliability as the insulating substrate and show the excellent radiation property. Moreover, it is possible to accurately position the plurality of power-module substrates 21 (the small circuit layers 12S) and advance high integration by joining the plurality of the power-module substrates 21 (the small circuit layers 12S) on one radiation plate.

Moreover, by using the power-module substrate unit 51 in which the plurality of power-module substrates 21 are joined on one radiation plate 30, an integrated power module can be easily manufactured as the power module 100 of the present embodiment. Since the power-module substrate unit 51 is united by one radiation plate 30, the position shift, the deformation and the like are hardly occurred even if the resin pressure is applied. Accordingly, the position accuracy can be easily obtained and high-integration can be realized.

In the above embodiment, the power-module substrate unit 51 is structured using the flat plate-shape radiation plate 30 though, it is possible to use a radiation plate having a flat plate with fin in which deformation by fluctuation of temperature is small, such as pin fin, or a radiation plate having uneven thickness, or the like. In this case, when a thickness of a flat plate on which a metal layer is bonded is a thickness t2 of a radiation plate, forming a relation between the radiation plate and a first copper layer, i.e., a ratio $(t1 \times A1 \times \sigma1)/(t2 \times A2 \times \sigma2)$ is not smaller than 0.80 and not larger than 1.20, the symmetrical structure centering the ceramic substrate layer 11 can be structured even in a power-module substrate unit using the radiation plate having a complicated shape.

Figure 5:
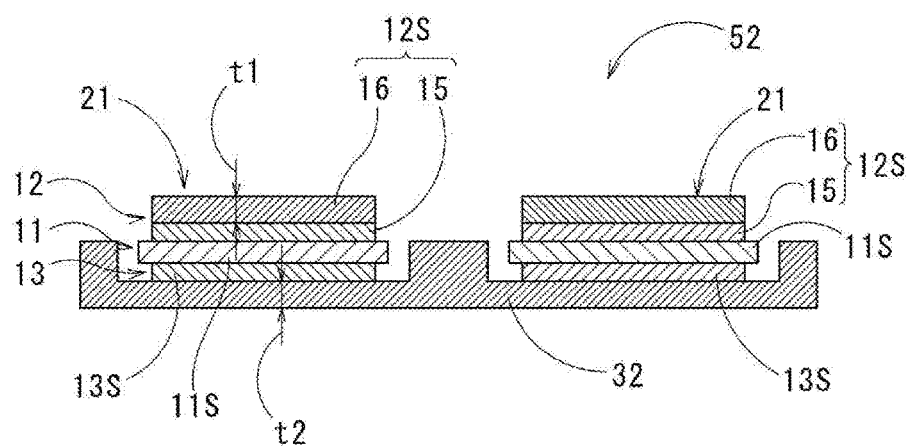
[FIG. 5] It is a sectional view of a power-module substrate unit of a second embodiment explaining a relation of thicknesses between a first copper layer and a radiation plate.

For example, in a power-module substrate unit 52 of a second embodiment shown in FIG. 5, a radiation plate 32 is not an even flat plate, but has parts with various thicknesses: even in this case, the symmetric structure centering the ceramic substrate layer 11 can be structured by setting the relation between the first copper layers 16 and the radiation plate 32 at the bonding positions of the first aluminum layers 15 with the first copper layers 16 and the bonding position of the metal layer 13 with the radiation plate 32 into the ratio $(t1 \times A1 \times \sigma1)/(t2 \times A2 \times \sigma2)$ not smaller than 0.80 and not larger than 1.20.

In this case, A1 (mm$^2$) is a bonding area between the first aluminum layer 15 and the first copper layer 16, and A2 (mm$^2$) is a bonding area between the metal layer 13 and the radiation plate 32. In the power-module substrate unit 52, in the respective cases of the ratio $(t1 \times A1 \times \sigma1)/(t2 \times A2 \times \sigma2)$ is 1.0, not smaller than 0.80 and smaller than 1.00, or larger than 1.00 and not larger than 1.20, the symmetric structure centering the ceramic substrate layer 11 is favorably structured like the first embodiment. Accordingly, the internal stresses on both the surface of the ceramic substrate layer 11 by heating or the like are not much biased, so that it is possible to prevent the warp deformation and show the excellent radiation property.

The bonding area A1 is a sum total of respective bonding areas between the first copper layers 16 and the first aluminum layers 15 of the power-module substrates 21. Similarly, the bonding area A2 is a sum total of respective bonding areas between the small metal layers 13S of the power-module substrates 21 and the radiation plate 30.

Figure 6:
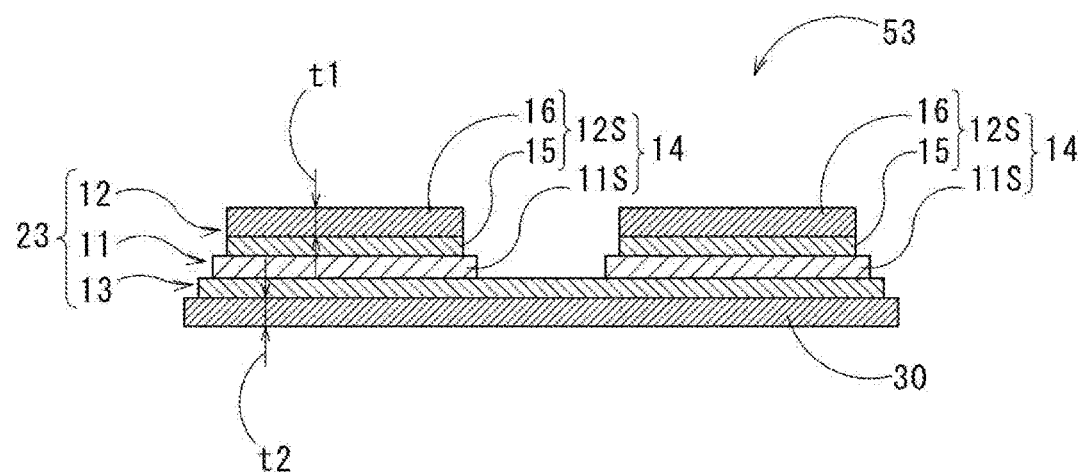
[FIG. 6] It is a sectional view showing a power-module substrate unit of a third embodiment according to the present invention.

FIG. 6 shows a power-module substrate unit 53 of a third embodiment. In this power-module substrate unit 53, the ceramic substrate layer 11 is structured by a same number of the small ceramic substrates 11S as that of the small circuit layers 12S, and the metal layer 13 is made of one plate. Layered substrates 14 in which the small circuit layers 12S and the small ceramic substrates 11S are bonded respectively are bonded with spacing on the metal layer 13, so that power-module substrate 23 is formed. By joining the metal layers 13 of the power-module substrates 23 on the radiation plate 30, the power-module substrate unit 53 is formed.

Also in this case, the symmetric structure centering the ceramic substrate layer 11 can be structured by setting the relation between the first copper layers 16 and the radiation plate 30 at the bonding positions of the first aluminum layers 15 with the first copper layers 16 and the bonding position of the metal layer 13 with the radiation plate 30 into the ratio $(t1 \times A1 \times \sigma1)/(t2 \times A2 \times \sigma2)$ not smaller than 0.80 and not larger than 1.20. In this case, the bonding area between the first aluminum layer 15 and the first copper layer 16 is A1 (mm$^2$), and the bonding area between the metal layer 13 and the radiation plate 30 is A2 (mm$^2$).

Also in a case in which the bonding area A1 and the bonding area A2 are different as in the power-module substrate unit 53 of the present embodiment, the symmetric structure centering the ceramic substrate layer 11 can be favorably structured similarly to the first embodiment, by setting the relation between the first copper layers 16 and the radiation plate 30 at these bonding positions into the ratio $(t1 \times A1 \times \sigma1)/(t2 \times A2 \times \sigma2)$ not smaller than 0.80 and not larger than 1.20. In other words, in the power-module substrate unit 53, in cases in which the ratio $(t1 \times A1 \times \sigma1)/(t2 \times A2 \times \sigma2)$ is 1.00, not smaller than 0.80 and smaller than 1.00, or larger than 1.00 and not larger than 1.20, the symmetric structure centering the ceramic substrate layer 11 is structured favorably as in the first embodiment. The bonding area A1 is a sum total of respective bonding areas between the first copper layers 16 to the firs aluminum layers 15 in the layered substrates 14.

Figure 7:
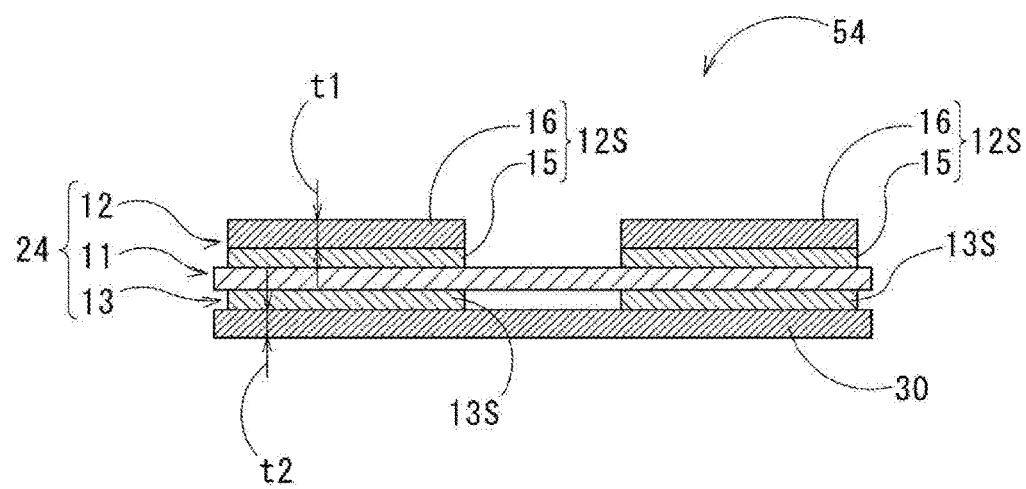
[FIG. 7] It is a sectional view showing a power-module substrate unit of a fourth embodiment according to the present invention.

FIG. 7 shows a power-module substrate unit 54 of a fourth embodiment. In the power-module substrate unit 54, the ceramic substrate layer 11 is made of one plate, and the metal layer 13 is structured by a same number of the small metal layers 13S as that of the small circuit layers 12S. The small circuit layers 12S and the small metal layers 13S are bonded on the ceramic substrate layer 11 therebetween with spacing in a surface direction of the ceramic substrate layer 11, so that a power-module substrate 24 is formed. The power-module substrate unit 54 is formed by bonding the metal layer 13 (the small metal layers 13S) of the power-module substrate 24 on the radiation plate 30.

As described above, also in a case in which the ceramic substrate layer 11 is made of one plate, the symmetric structure centering the ceramic substrate layer 11 can be structured by setting the relation between the first copper layers 16 and the radiation plate 30 at the bonding positions between the first aluminum layers 15 and the first copper layers 16 and the bonding positions between the small metal layers 13S and the radiation plate 30 into the ratio (t1×A1×σ1)/(t2×A2×σ2) not smaller than 0.8 and not larger than 1.20. In this case, A1 (mm$^2$) is the bonding area between the first aluminum layer 15 and the first copper layer 16, and A2 (mm$^2$) is the bonding area between the metal layer 13 and the radiation plate 30.

As described above, in the power-module substrate unit 54, in cases in which the ratio (t1×A1×σ1)/(t2×A2×σ2) is 1.00, not smaller than 0.80 and smaller than 1.00, or larger than 1.00 and not larger than 1.20, the symmetric structure centering the ceramic substrate layer 11 can be favorably formed as in the first embodiment. Moreover, as in the power-module substrate unit 54 of the fourth embodiment, by forming the ceramic substrate layer 11 having small linear-expansion coefficient and high rigidity from one plate, the internal stresses on both the surfaces of the ceramic substrate layer 11 by heating or the like are not much biased, so that it is possible to prevent the warp deformation more efficiently. The bonding area A1 is a sum total of bonding areas of the first copper layers 16 to the first aluminum layers 15 in the power-module substrate 24. Similarly, the bonding area A2 is a sum total of bonding areas of the small metal layers 13S of the power-module substrate 24 to the radiation plate 30.

Figure 8:
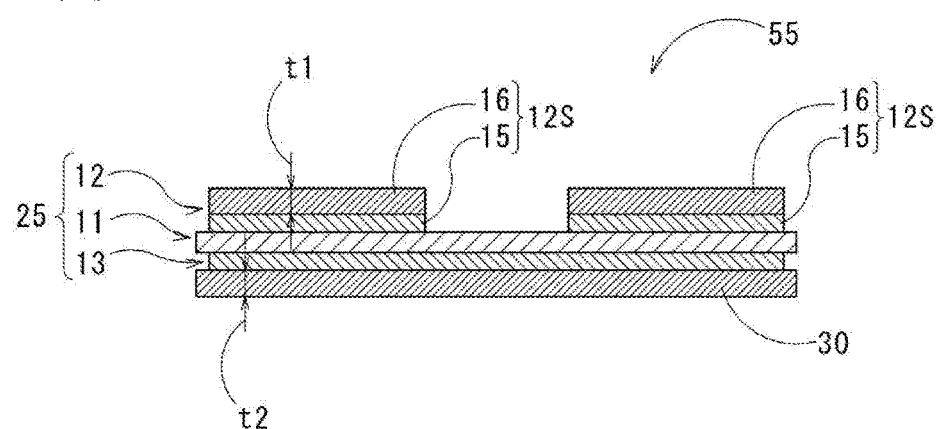
[FIG. 8] It is a sectional view showing a power-module substrate unit of a fifth embodiment according to the present invention.

FIG. 8 shows a power-module substrate unit 55 of a fifth embodiment. In this power-module substrate unit 55, the ceramic substrate layer 11 is made of one plate, and the metal layer 13 is also made of one plate. The small circuit layers 12S are bonded on one surface of the ceramic substrate layer 11 with spacing, and the metal layer 13 is bonded on the other surface of the ceramic substrate layer 11, so that a power-module substrate 25 is formed. The power-module substrate unit 55 is formed by bonding the metal layer 13 of the power-module substrate 25 on the radiation plate 30.

As described above, even in a case in which the ceramic substrate layer 11 is made of one plate and the metal layer 13 is made of one plate, the symmetric structure centering the ceramic substrate layer 11 can be structured by setting the relation between the first copper layers 16 and the radiation plate 30 into the ratio (t1×A1×σ1)/(t2×A2×σ2) not smaller than 0.8 and not larger than 1.20 at the bonding positions of the first aluminum layers 15 with the first copper layers 16 and the bonding position of the metal layer 13 with the radiation plate 30. In this case, A1 (mm$^2$) is the bonding area of the first aluminum layers 15 with the first copper layers 16, and A2 (mm$^2$) is the bonding area of the metal layer 13 with the radiation plate 30.

As described above, in the power-module substrate unit 55, in cases in which the ratio (t1×A1×σ1)/(t2×A2×σ2) is 1.00, not smaller than 0.8 and smaller than 1.00, or larger than 1.00 and not larger than 1.20, the symmetric structure centering the ceramic substrate layer 11 is favorably structured as in the first embodiment. Also in this case, by forming the ceramic substrate layer 11 having small linear-expansion coefficient and high rigidity from one plate, the internal stresses on both the surfaces of the ceramic substrate layer 11 by heating or the like are not much biased, so that it is possible to prevent the warp deformation more efficiently. The bonding area A1 (mm$^2$) is a sum total of bonding areas of the first copper layers 16 with the first aluminum layers 15 in the respective small circuit layers 12S.

Figure 9:
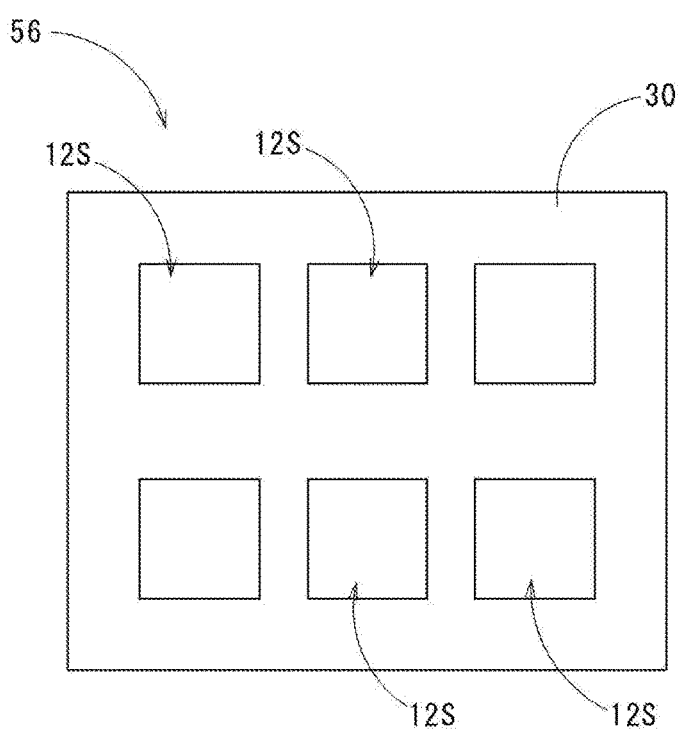
[FIG. 9] It is a frontal view of a power-module substrate unit of another embodiment according to the present invention.

In the aforementioned respective embodiments, power modules having so-called 2-in-1 structure in which two circuits (the small circuit layers 12S) are mounted on the radiation plate 30 were explained: while it is easy to develop to a 3-in-1 structure on which three circuits are mounted, or a 6-in-1 structure in which six circuits (the small circuit layers 12S) are mounted on the radiation plate 30 as is the case in a power-module substrate unit 56 shown in FIG. 9 by using the structure of the power-module substrate unit and the power module of the present invention. FIG. 9 shows the small circuit layers 12S and the radiation plate 30 but omits the ceramic substrate layer 11 and the metal layer 13 from illustration.

Furthermore, it is possible to gain a structure in which both sides are cooled by a structure in which the power-module substrate units having the radiation plates are arranged on both sides of the semiconductor element respectively.

In the above embodiments, the first aluminum layers 15 and the first copper layers 16 are bonded directly by solid diffusion, and the metal layer 13 and the radiation plates 30 or 32 are bonded directly by solid diffusion.

However, the present invention is not limited to a case of direct solid diffusion, and the following structure can be applied.

In the structure of the above embodiments, the first aluminum layers 15 and the first copper layers 16, and the metal layer 13 and one of or both the radiation plates 30 and 32 may be bonded by solid diffusion with a titan layer therebetween. In this case, intermetallic compound of Al and Cu can be prevented from growing when temperature of the power-module substrate unit rises: it is possible to improve the bonding reliability and life.

A thickness of the titan layer may be not smaller than 5 µm and not larger than 50 µm. If the thickness of the titan layer is smaller than 5 µm, the titan layer is easy to break when bonding by solid diffusion, so that the effect of decreasing the growth of the intermetallic compound of Al and Cu is deteriorated. If the thickness of the titan layer is larger than 50 µm, since the thick titan layer has low thermal conductivity, thermal resistance of the power-module substrate unit is increased remarkably.

Influence of the titan layer on the warp deformation can be ignored.

As a producing method of the power-module substrate unit including the titan layer, the solid diffusion bonding may be performed arranging a titan foil between the first aluminum layers 15 and the first-layer copper plates 16a, or between the metal layer 13 and the radiation plates 30 and 32 when producing by the producing method described in the above embodiments. It is preferable that a thickness of the titan foil be not smaller than 5 µm and not larger than 50 µm.

EXAMPLES

Next, Examples for confirming effects of the present invention will be explained.

As test pieces of the power-module substrate unit, prepared were a ceramic substrate made of AlN having a thickness of 0.635 mm as the ceramic substrate layer, and an aluminum plate having a thickness of 0.6 mm and purity 99.99 mass % or higher (4N) as the first aluminum layer and the metal layer (the first-layer aluminum plate and the metal layer aluminum layer) was prepared. Plate materials having thicknesses shown in Table 1 were prepared as the first copper layer and the radiation plate (the first-layer copper plate and the radiation plate) by C1020 (yield stress=195 N/mm$^2$) or heat residence alloy ZC manufactured by Mitsubishi Shindoh Co., Ltd. (yield stress=280 N/mm$^2$). Values of the yield stresses were at room temperature (25° C.). The respective members were made to have plate sizes shown in Table 1.

The test pieces of the power-module substrate unit were made by bonding these by the bonding methods in the aforementioned embodiments. "Embodiment" in Table 1 means the producing method of the embodiment by which the respective test pieces were made. As a conventional example, a power-module substrate unit (Conventional Example 1 in Table 1) was manufactured by the bonding method described in the first embodiment but the first copper layers of the circuit layer were not bonded and the first copper layers were not formed (i.e., the circuit layer was formed only by the first aluminum layers).

In the Table 1, the "Number of Circuits" denotes the number of small circuit layers forming the circuit layer. The "Number of Assemblies" of the ceramic substrate layer denotes the number of the small ceramic substrates when the ceramic substrate layer is structured by the plurality of small ceramic substrates. The "Number of Assemblies" of the metal layer denotes the number of the small metal layers when the metal layer is structured by the plurality of small metal layers. Accordingly, for example, when the ceramic substrate layer is made from one plate, the "Number of Assemblies" is denoted as "1". The "Plane Size" in the circuit layer, the ceramic substrate layer and the metal layer denotes the respective sizes of the circuit layer, the ceramic substrate layer and the metal layer, and these were made as shown in Table 1. The radiation plates each had a flat plate shape and the whole plane size thereof was 100 mm×100 mm. The "Ratio" in Table 1 denotes the ratio $(t1 \times A1 \times \sigma1)/(t2 \times A2 \times \sigma2)$.

With respect to the respective obtained test pieces, the warp amount (the primary warp deformation) at normal temperature (25° C.) after bonding and the warp amount when heated to 285° C. (the heated warp) simulating the mounting process were measured respectively. The warp amounts were evaluated by measuring changes of flatness at a back surface of the radiation plate using a moire-type three-dimensional shape measuring device. The warp amounts were positive values (+) when it was convex at the circuit layer side, or negative values (−) when it was dented at the circuit layer side.

Yield rates in the mounting process of the semiconductor elements were evaluated. The semiconductor elements were mounted on the respective first copper layers of the 100 test pieces. If the semiconductor element was shifted 100 μm or larger in a horizontal direction from the mounted position, it was evaluated to be not good. If two or less were not good, it was evaluated to be "A" as the most favorable case: if not less than three and less than 10 were not good, it was evaluated to be "B" as a favorable case: and if not less than 10 were not good, it was evaluated to be "C" as a poor case. The results were shown in Table 1.

TABLE 1

| | | Circuit Layer | | | Ceramic Substrate | | Metal Layer | |
| | | First Copper Layer | | | | | | |
| TEST PIECE | | Thickness t1 (mm) | Yield Stress σ1 (N/mm²) | Plane Size per one (mm × mm) | Number of Circuits (Number of Assemblies) | Plane Size per one (mm × mm) | Number of Assemblies | Plane Size per one (mm × mm) | Number of Assemblies |
|---|---|---|---|---|---|---|---|---|---|
| Invention | Ex. 1 | 2.00 | 195 | 37 × 37 | 1 | 40 × 40 | 1 | 37 × 37 | 1 |
| | Ex. 2 | 2.00 | 195 | 37 × 37 | 4 | 40 × 40 | 4 | 37 × 37 | 4 |
| | Ex. 3 | 3.00 | 195 | 37 × 37 | 4 | 40 × 40 | 4 | 37 × 37 | 4 |
| | Ex. 4 | 2.00 | 195 | 37 × 37 | 4 | 40 × 40 | 4 | 37 × 37 | 4 |
| | Ex. 5 | 2.00 | 195 | 37 × 37 | 4 | 40 × 40 | 4 | 37 × 37 | 4 |
| | Ex. 6 | 3.00 | 195 | 35 × 35 | 4 | 40 × 40 | 4 | 37 × 37 | 4 |
| | Ex. 7 | 3.00 | 195 | 35 × 35 | 4 | 40 × 40 | 4 | 37 × 37 | 4 |
| | Ex. 8 | 2.00 | 195 | 37 × 37 | 4 | 40 × 40 | 4 | 79 × 79 | 1 |
| | Ex. 9 | 2.00 | 195 | 37 × 37 | 4 | 40 × 40 | 4 | 79 × 79 | 1 |
| | Ex. 10 | 2.00 | 195 | 37 × 37 | 4 | 82 × 82 | 1 | 37 × 37 | 4 |
| | Ex. 11 | 2.00 | 195 | 37 × 37 | 4 | 82 × 82 | 1 | 37 × 37 | 4 |
| | Ex. 12 | 2.00 | 195 | 37 × 37 | 4 | 82 × 82 | 1 | 37 × 37 | 4 |
| | Ex. 13 | 2.00 | 195 | 37 × 37 | 4 | 82 × 82 | 1 | 79 × 79 | 1 |
| | Ex. 14 | 2.00 | 195 | 37 × 37 | 4 | 82 × 82 | 1 | 79 × 79 | 1 |
| Comparative | Ex. 1 | 1.40 | 195 | 37 × 37 | 4 | 40 × 40 | 4 | 37 × 37 | 4 |
| | Ex. 2 | 3.00 | 280 | 37 × 37 | 4 | 40 × 40 | 4 | 37 × 37 | 4 |
| | Ex. 3 | 1.50 | 195 | 37 × 37 | 4 | 40 × 40 | 4 | 79 × 79 | 1 |
| | Ex. 4 | 1.20 | 195 | 37 × 37 | 4 | 82 × 82 | 1 | 37 × 37 | 4 |
| | Ex. 5 | 1.50 | 195 | 37 × 37 | 4 | 82 × 82 | 1 | 79 × 79 | 1 |
| | Ex. 6 | 3.00 | 195 | 37 × 37 | 4 | 82 × 82 | 1 | 79 × 79 | 1 |
| Conventional Ex. 1 | | — | — | 37 × 37 | 4 | 40 × 40 | 4 | 37 × 37 | 4 |

| | | Radiation Plate | | | Warp Amount (μm) | | | | |
| TEST PIECE | | Thickness t2 (mm) | Yield Stress σ2 (N/mm²) | Ratio | Initial | Heated | Difference | Yield Rate | Embodiment |
|---|---|---|---|---|---|---|---|---|---|
| Invention | Ex. 1 | 1.40 | 280 | 0.99 | −45 | −93 | 48 | A | 1st Embodiment |
| | Ex. 2 | 1.40 | 280 | 0.99 | −51 | −101 | 50 | A | 1st Embodiment |
| | Ex. 3 | 3.00 | 195 | 1.00 | −60 | −98 | 38 | A | 1st Embodiment |
| | Ex. 4 | 1.25 | 280 | 1.11 | −101 | −212 | 111 | A | 1st Embodiment |
| | Ex. 5 | 1.70 | 280 | 0.82 | 95 | −40 | 135 | B | 1st Embodiment |
| | Ex. 6 | 3.00 | 195 | 0.89 | 51 | −76 | 127 | B | 1st Embodiment |
| | Ex. 7 | 2.40 | 195 | 1.12 | −55 | −86 | 31 | A | 1st Embodiment |
| | Ex. 8 | 2.00 | 195 | 0.88 | −74 | −124 | 50 | A | 3rd Embodiment |

TABLE 1-continued

|  | | | | | | | | | |
|---|---|---|---|---|---|---|---|---|---|
|  | Ex. 9 | 1.60 | 195 | 1.10 | −112 | −167 | 55 | A | 3rd Embodiment |
|  | Ex. 10 | 2.00 | 195 | 1.00 | −69 | −116 | 47 | A | 4th Embodiment |
|  | Ex. 11 | 2.30 | 195 | 0.87 | 58 | −70 | 128 | B | 4th Embodiment |
|  | Ex. 12 | 1.70 | 195 | 1.18 | −84 | −125 | 41 | A | 4th Embodiment |
|  | Ex. 13 | 2.00 | 195 | 0.88 | −54 | −102 | 48 | A | 5th Embodiment |
|  | Ex. 14 | 1.60 | 195 | 1.10 | −96 | −142 | 46 | A | 5th Embodiment |
| Comparative | Ex. 1 | 1.40 | 280 | 0.70 | 108 | −112 | 220 | C | 1st Embodiment |
|  | Ex. 2 | 2.00 | 280 | 1.50 | −259 | −526 | 267 | C | 1st Embodiment |
|  | Ex. 3 | 2.00 | 195 | 0.66 | −145 | −250 | 395 | C | 3rd Embodiment |
|  | Ex. 4 | 2.00 | 195 | 0.60 | 122 | −226 | 348 | C | 4th Embodiment |
|  | Ex. 5 | 2.00 | 195 | 0.66 | 126 | −210 | 336 | C | 5th Embodiment |
|  | Ex. 6 | 2.00 | 195 | 1.32 | −155 | −387 | 232 | C | 5th Embodiment |
| Conventional Ex. 1 | | 3.00 | 280 | — | 417 | −629 | 1046 | C | — |

As recognized from Table 1, in Conventional Example 1 in which the first copper layer was not provided, the warp amounts at room temperature and when heated were large, a number of inferiors were occurred when the semiconductor elements were mounted. Meanwhile, in Invention Examples 1 to 14 in which the first copper layer was provided and the ratio $(t1 \times A1 \times \sigma1)/(t2 \times A2 \times \sigma2)$ was not smaller than 0.80 and not larger than 1.20, it was recognized that the power-module substrate unit in which the warp amount at room temperature and the warp amount when heated were small can be obtained. It was also recognized that the semiconductor elements can be mounted with high yield rate by using such a power-module substrate unit.

Especially, in Invention Examples 1 to 4, 7 to 10, and 12 to 14 in which the warp amount at normal temperature was ±120 μm or smaller and difference of the warp amounts between at normal temperature and when heated was smaller than 120 μm, it was recognized that the power-module substrate unit in which the semiconductor elements can be mounted with higher yield rate can be obtained.

Meanwhile, in Comparative Examples 1 to 6 in which the ratio $(t1 \times A1 \times \sigma1)/(t2 \times A2 \times \sigma2)$ was smaller than 0.80 or larger than 1.20, although having the first copper layer, it was recognized that the warp amount at normal temperature and the warp amount when heated of the power-module substrate unit were large, so that the yield rate of the semiconductor elements in the mounting process was low.

The present invention is not limited to the above-mentioned embodiments and various modifications may be made without departing from the scope of the present invention.

INDUSTRIAL APPLICABILITY

It is possible to provide a power-module substrate unit and a power module in which deformation by fluctuation of temperature is small, radiation performance is good, and circuits can be integrated.

REFERENCE SIGNS LIST 11 ceramic substrate layer
11S small ceramic substrate
12 circuit layer
12S small circuit layer
13 metal layer
13a metal-layer aluminum plate
13S small metal layer
14 layered substrate
15 first aluminum layer
15a first-layer aluminum plate
16 first copper layer
16a first-layer copper plate
18 brazing foil
19 bonded body
21 to 25 power-module substrate
30, 32 radiation plate
30a exposed surface
40 molded resin
51, 52, 53, 54, 55, 56 power-module substrate unit
60 semiconductor element
70 external-connection lead frame
80 heat sink
81 top plate
82 cooling part
83 pass
100 power module
110 press device
111 base plate
112 guide post
113 fixing plate
114 pressing plate
115 biasing device
116 carbon sheet

The invention claimed is:
1. A power-module substrate unit comprising:
a ceramic substrate layer;
a circuit layer structured from a plurality of small circuit layers joined on one surface of the ceramic substrate layer;
a metal layer joined on other surface of the ceramic substrate layer; and
one radiation plate joined on the metal layer, wherein
each of the small circuit layers has a layered structure comprising a first aluminum layer joined on the one surface of the ceramic substrate layer and a first copper layer joined on the first aluminum layer by solid diffusion bonding;
the metal layer is made from a same material as that of the first aluminum layer;
the radiation plate is made from copper or copper alloy and joined on the metal layer by solid diffusion bonding; and
a ratio $(t1 \times A1 \times \sigma1)/(t2 \times A2 \times \sigma2)$ is not smaller than 0.80 and not larger than 1.20: where a thickness of the first copper layer is t1 (mm); a bonding area of the first copper layer is A1 (mm$^2$); an yield stress of the first copper layer is $\sigma1$ (N/mm$^2$); a thickness of the radiation plate at a bonding position to the metal layer is t2 (mm); a bonding area of the radiation plate is A2 (mm$^2$); and an yield stress of the radiation plate is $\sigma2$ (N/mm$^2$).
2. The power-module substrate unit according to claim 1, wherein the ceramic substrate layer is structured by a same number of small ceramic substrates as that of the small circuit layers;
the metal layer is structured by a same number of small metal layers as that of the small circuit layers; and
a plurality of power-module substrates made by joining the small circuit layers and the small metal layers to each other with the small ceramic substrate therebetween are joined on the radiation plate with spacing.

3. The power-module substrate unit according to claim 1 comprising a power-module substrate joined on the radiation plate with the metal layer made of one plate therebetween, wherein
the ceramic substrate layer is structured by a same number of small ceramic substrate as that of the small circuit layers;
layered substrates are structured by joining the small circuit layers and the small ceramic substrates; and
the power-module substrate is structured by joining the layered substrates with spacing on the metal plate.

4. The power-module substrate unit according to claim 1, comprising a power-module substrate joined on the radiation plate with the metal layer therebetween, wherein
the ceramic substrate layer is structured by one plate;
the metal layer is structured by a same number of small metal layers as that of the small circuit layers; and
the power-module substrate is structured by joining the small circuit layers and the small metal layers with the ceramic substrate layer therebetween with spacing in a surface direction of the ceramic substrate layer.

5. The power-module substrate unit according to claim 1 comprising a power-module substrate joined on the radiation plate with the metal layer structured by one plate therebetween, wherein
the ceramic substrate layer is structured by one plate;
the small circuit layers are joined on the one surface of the ceramic substrate layer with spacing; and
the power-module substrate is structured by joining the metal layer on the other surface of the ceramic substrate layer.

6. The power-module substrate unit according to claim 1, wherein the first aluminum layer and the first copper layer are joined with a titan layer therebetween by solid diffusion bonding.

7. The power-module substrate unit according to claim 1, wherein the metal layer and the radiation plate are joined with a titan layer therebetween by solid diffusion bonding.

8. The power-module substrate unit according to claim 1, wherein the first aluminum layer and the first copper layer, and the metal layer and the radiation plate are respectively joined with titan layers therebetween by solid diffusion bonding.

9. A power module comprising
the power-module substrate unit according to claim 1;
a semiconductor element and an external-connection lead frame which are connected to at least one of the small circuit layers of the power-module substrate unit; and
a molded resin sealing the semiconductor element and the power-module substrate unit except a surface of the radiation plate.

* * * * *